United States Patent [19]

Shinohara et al.

[11] Patent Number: 4,920,396
[45] Date of Patent: Apr. 24, 1990

[54] CMOS HAVING BURIED LAYER FOR CARRIER RECOMBINATION

[75] Inventors: Toshiro Shinohara; Teruyoshi Mihara; Kenji Yao, all of Yokosuka, Japan

[73] Assignee: Nissan Motor Company, Limited, Yokohama, Japan

[21] Appl. No.: 179,315

[22] Filed: Apr. 8, 1988

[30] Foreign Application Priority Data

Apr. 13, 1987 [JP] Japan .................. 62-88912

[51] Int. Cl.[5] .................. H01L 27/02; H01L 29/167; H01L 29/161
[52] U.S. Cl. .................. 357/42; 357/64; 357/16; 357/86
[58] Field of Search .................. 357/42, 64, 16

[56] References Cited

U.S. PATENT DOCUMENTS

| | | | |
|---|---|---|---|
| 3,796,929 | 3/1974 | Nicholas et al. | 357/51 |
| 3,925,120 | 12/1975 | Saida et al. | 357/42 |
| 4,053,925 | 10/1977 | Burr et al. | 357/64 |
| 4,209,713 | 6/1980 | Satou et al. | 307/200 B |
| 4,259,683 | 3/1981 | Adler et al. | 357/64 |
| 4,513,309 | 4/1985 | Cricchi | 357/42 |
| 4,620,211 | 10/1986 | Baliga et al. | 357/38 |
| 4,671,846 | 6/1987 | Shimbo et al. | 156/629 |
| 4,752,818 | 6/1988 | Kushida et al. | 357/64 |

FOREIGN PATENT DOCUMENTS 60-51700 3/1985 Japan .
61-216363 2/1987 Japan .

OTHER PUBLICATIONS

Kyomasu, et al., "Analysis of Latch–Up in CMOS IC", Denshi–Tsushin–Gakkai–Ronbunshi, 1978/2 vol. J61–CN02, pp. 106–113.
IEEE Electron Device Letters, vol. EDL-6, No. 5, Love, R. P. et al., "Shorter Turn–Off Times in Insulated Gate Transistors by Proton Inplantation", pp. 224–226.

Primary Examiner—Rolf Hille
Assistant Examiner—Robert P. Limanek
Attorney, Agent, or Firm—Foley & Lardner, Schwartz, Jeffery, Schwaab, Mack, Blumenthal & Evans

[57] ABSTRACT

In order to improve latchup withstanding capability, a CMOS device is provided with at least one recombination layer which is buried in either or both substrate regions of a pMOS and a nMOS at such a position that a depletion layer formed at a pn junction between both substrate regions of the pMOS and nMOS does not reach the recombination layer. The recombination layer is a polycrystalline silicon or amorphous silicon layer having plentiful carrier recombination centers, or a layer having plentiful traps formed by ion implantation, or a layer of a compound semiconductor having a small band gap.

10 Claims, 6 Drawing Sheets

CMOS HAVING BURIED LAYER FOR CARRIER RECOMBINATION

REFERENCES TO RELATED APPLICATIONS

U.S. patent application Ser. Nos. 07/064,852 (filed on June 22, 1987) and 07/081,391 (filed on Aug. 4, 1987) both relate to CMOS devices designed to prevent latchup. A U.S. application Ser. No. 07/119,453 (filed on Nov. 10, 1987) discloses a layer which is similar to a recombination layer of the present invention, but formed in a conductivity modulated MOSFET.

BACKGROUND OF THE INVENTION

The present invention relates to a CMOS device, and more specifically to a CMOS device improved in withstanding latchup.

In the structure of a CMOS, there is formed parasitic pnp and npn transistors which tend to interact and cause latchup.

FIGS. 7 and 8 show one conventional CMOS device (U.S. Pat. No. 4,209,713, or Denshi-Tsushin-Gakkai-Ronbunshi, '78/2 vol J61-CN02).

An n-channel MOSFET (nMOS) 7 is formed in a p well 2 which is formed in a major surface of an n-type silicon substrate 1, and a p-channel MOSFET (pMOS) 13 is formed directly in the n substrate 1. The nMOS 7 is constituted by a pair of an n+ source region 3 and an n+ drain region 4 which are both formed in the p well 2, and a gate electrode 5 formed on a gate insulating layer (not shown). A well contact region 6 of the p+ type is formed in the p well 2, which serves as a substrate region of the nMOS 7. The pMOS 13 is constituted by a pair of a p+ source region 8 and a p+ drain region 9 which are both formed directly in the n substrate 1, and a gate electrode 11 formed on a gate insulating layer (not shown). A substrate contact region 12 of the n+ type is formed in the substrate 1, which serves as a substrate region of the pMOS 13.

The nMOS 7 and pMOS 13 are interconnected to form a CMOS inverter. The gate electrodes 5 and 11 of both devices 7 and 13 are connected together and connected to an input terminal 14. The drain regions 4 and 9 are connected together, and connected to an output terminal 15. A supply terminal 16 of a supply voltage Vdd is connected to the source region 8 of the pMOS 13, and the n+ substrate contact region 12. Therefore, the n substrate region 1 is connected with the supply terminal 16 through the regions 8 and 12. A low potential terminal 17 of a potential Vss is connected to the source region 3 of the nMOS 7 and the p+ well contact region 6. Therefore, the p well 2 is connected with the low potential terminal 17 through the regions 3 and 6.

In the CMOS device having such a structure, there are formed parasitic pnp transistors $Q_1$ and $Q_3$, and parasitic npn transistors $Q_2$ and $Q_4$, as shown in FIG. 7. These parasitic bipolar transistors $Q_1$–$Q_4$ are interconnected, and form a pnpn thyristor structure.

In FIG. 8, $Rn_1$ is a base resistance of the transistor $Q_1$, $Rn_3$ is a base resistance of the transistor $Q_3$, and Rp is a base resistance of the transistor $Q_4$.

When a positive surge voltage equal to or greater than the supply voltage Vdd enters through the output terminal 15, the CMOS device falls into latchup in the following manner. This surge voltage causes a base current $Ib_1$ to flow between the base and emitter of the transistor $Q_1$, and accordingly a collector current $Ic_1 = Ib_1 \times Hfe_1$ (where $Hfe_1$ is a current gain of the transistor $Q_1$) flows through the base resistance Rp into the low potential terminal 17.

When the voltage drop developed across the base resistance Rp by the collector current $Ic_1$ becomes equal to or greater than a base threshold voltage $Vbth_4$ ($Ic_1 \times Rp > 0.6$ V), then a base current $Ib_4$ flows into the transistor $Q_4$, which accordingly draws in a collector current $Ic_4 = Ib_4 \times Hfe_4$ (where $Hfe_4$ is a current gain of the transistor $Q_4$) from the supply terminal 16 through the base resistance $Rn_3$ of the transistor $Q_3$.

This collector current $Ic_4$ generates a voltage drop $Ic_4 \times Rn_3$ across the resistance $Rn_3$. When this voltage drop becomes equal to or greater than a base threshold voltage $Vbth_3$ (approximately equal to 0.6 V) of the transistor $Q_3$, then a current $Ib_3$ flows through the base of the transistor $Q_3$, and the transistor $Q_3$ turns on. Accordingly, a collector current $Ic_3 = Ib_3 \times Hfe_3$ (where $Hfe_3$ is a current gain of the transistor $Q_3$) flows into the transistor $Q_4$ and its base resistance Rp.

In this way, both of the pnp transistor $Q_3$ and the npn transistor $Q_4$ are turned on, and the pnpn thyristor structure formed by both transistors $Q_3$ and $Q_4$ is brought into the latchup state, so that an excessive current flows between the supply terminal 16 and the lower potential terminal 17. Latchup persists until the power supply is cut off.

A negative surge voltage equal to or lower than the low potential Vss also triggers latchup when it is applied to the output terminal 15. In this case, a base current $Ib_2$ is caused to flow in the npn transistor $Q_2$, and accordingly, a collector current $Ic_2$ flows into the transistor $Q_2$ through the base resistance $Rn_3$ of the transistor $Q_3$. This collector current $Ic_2$ develops a voltage drop $Ic_2 \times Rn_3$ across the resistance $Rn_3$. When this voltage drop becomes equal to or greater than the base threshold voltage $Vbth_3$ of the transistor $Q_3$, the transistor $Q_3$ is turned on, and the collector current $Ic_3$ flows through the base resistance Rp of the transistor $Q_4$. Therefore, the transistor $Q_4$ is also turned on when $Ic_3 \times Rp$ becomes equal to or greater than $Vbth_4$. In this way, the thyristor operation causes latchup again.

Latchup is very serious. Latchup disables the CMOS from functioning properly. Furthermore, an excessive current flowing between the supply terminal 16 and the low potential terminal 17 due to latchup damages the device when the power dissipation exceeds the allowable limit.

Positive or negative surge voltages entering via the input terminal 14 can also trigger latchup of the CMOS. In general, the CMOS is provided with a voltage clamping circuit (not shown in FIG. 7) composed of diffused resistor and diffused diode, for the purpose of protecting the gate insulating layer from dielectric breakdown. The diffused regions of the voltage clamping circuit form pn junctions with the substrate, and these pn junctions form parasitic bipolar transistors. These parasitic bipolar transistors act and cause latchup when an excessive surge is applied to the input terminal 14.

There are various measures for preventing latchup. Widely used examples are as follows:

(i) Prevention of thyristor's turning on: The condition required to turn on the thyristor structure formed by the parasitic transistors $Q_3$ and $Q_4$ is given by $Hfe_3 \times Hfe_4 > 1$. Therefore, the thyristor is prevented from turning on by designing the CMOS structure such that $Hfe_3 \times Hfe_4$ becomes smaller than one.

(ii) Reduction of base resistances: Reduction of the base resistances $R_{n3}$ and $R_p$ of the transistors $Q_3$ and $Q_4$ causes reduction of the voltage drops developed across the resistances. Therefore, it becomes more difficult for the transistors $Q_3$ and $Q_4$ to turn on.

One conventional example is shown in FIG. 9. The CMOS structure shown in FIG. 9 is almost the same as the CMOS structure of FIG. 7, but different in the following points. In the structure of FIG. 9, the distance d between the pMOS 13, and the p well 2 is increased to a value equal to or greater than about 200 micrometers. Therefore, in each of the parasitic pnp transistors $Q_1$ and $Q_3$, the base width is increased, and accordingly, the current gain Hfe is decreased. Furthermore, an $n^+$-type substrate contact region 18 is formed in the n substrate 1 between the pMOS 13 and the nMOS 7, and a $p^+$-type well contact region 19 is formed in the p well 2 so as to surround the nMOS 7. With the contact regions 18 and 19, the base resistances $R_{n1}$, $R_{n3}$ and $R_p$ of the parasitic transistors $Q_1$, $Q_3$ and $Q_4$ are reduced.

In this device, the p well region 2 is spaced far from the drain region 9. Therefore, most of the holes which are injected from the drain region 9 into the n substrate 1 because of the positive surge voltage applied to the output terminal 1, recombine with electrons and disappear in the n substrate 1. It is only a very small fraction of the injected holes which can flow into the p well region 2 as the collector current $Ic_1$ of the transistor $Q_1$, and flow out through the base resistance $R_p$ into the low potential terminal 17.

Furthermore, the base resistance $R_p$ is reduced by the $p^+$ well contact region 19. As a result, the voltage drop $Ic_1 \times R_p$ is small, and the transistor $Q_4$ barely turns on.

If the collector current $Ic_1$ increases, and the transistor $Q_4$ is turned on because of increases of the voltage drop $Ic_1 \times R_p$, the collector current $Ic_4$ is supplied mostly from the substrate contact region 18, and the collector current $Ic_4$ coming from the substrate contact region 12 adjacent the source region 8 is very small.

The base resistance $R_n$ is reduced by formation of the $n^+$ substrate contact region 18. Therefore, the transistor $Q_4$ is barely turned on even if the collector current $Ic_4$ flows therethrough.

With this structure which makes it difficult for the parasitic thyristor to turn on, the CMOS device of FIG. 9 is improved in capability of withstanding latchup.

However, the CMOS device of FIG. 9 is disadvantageous in that the chip size and the fabricating cost are increased by the necessity for increasing the distance d between the pMOS 13 and the p well 2 beyond 200 micrometers.

FIG. 10 shows another conventional CMOS device. The CMOS structure of FIG. 10 is the same as that of FIG. 9 except that the device of FIG. 10 is further provided with a p-type hole collector region 21 in the n substrate 1 between the pMOS 13 and the $n^+$ substrate contact region 18. The hole collector region 21 is connected with the low potential terminal 17 of Vss, and therefore, serves as a collector of the pnp transistor $Q_1$.

When the positive surge equal to or greater than Vdd enters the device from the output terminal, the hole collector region 21 collects the holes injected from the drain region 9 of the pMOS 13 into the n substrate 1, and leads them to the low potential point of Vss. By so doing, the hole collector region 21 reduces the collector current $Ic_1$ of the transistor $Q_1$ flowing into the p well region 2, to a very low value.

In the CMOS structure of FIG. 10, the capability of withstanding latchup is improved with the hole collector region 21 instead of excessively increasing the distance d between the pMOS 13 and the p well 2, and hence without the necessity of increasing the chip size too much.

However, the CMOS structure of FIG. 10 requires not only the hole collector region 21, but also a metal lead connecting the hole collector region 21 to the low potential Vss, and a metal lead connecting the substrate contact region 18 to the supply voltage Vdd both of which must be formed on the top side of the semiconductor substrate 1. Therefore, the actual layout is considerably complicated, and reduction in chip size is prohibitively difficult.

SUMMARY OF THE INVENTION

It is an object of the present invention to provide a CMOS device which is improved in capability of withstanding latchup with a relatively simple structure suitable for chip size reduction.

According to the present invention, a semiconductor device comprises (i) a first substrate region of a first conductivity type formed in a semiconductor body, (ii) a second substrate region of a second conductivity type formed in the body so as to form a pn junction with the first substrate region, (iii) a first conductivity type channel MOSFET formed in said second substrate region and a second conductivity type channel MOSFET formed in said first substrate region, and (iv) a first recombination layer buried in said first substrate region for facilitating recombination of minority carriers at a position separate from the pn junction between the first and second substrate.

The first substrate region may be a planar layer and the second substrate region may be formed in a major surface of the first substrate region. Alternatively, the first substrate region may be formed in a major surface of the second substrate region having the form of a planar layer. It is optional to further provide a second recombination layer buried in the second substrate region and separated from the pn junction between the first and second substrate regions.

DETAILED DESCRIPTION OF THE INVENTION

Figure 1:
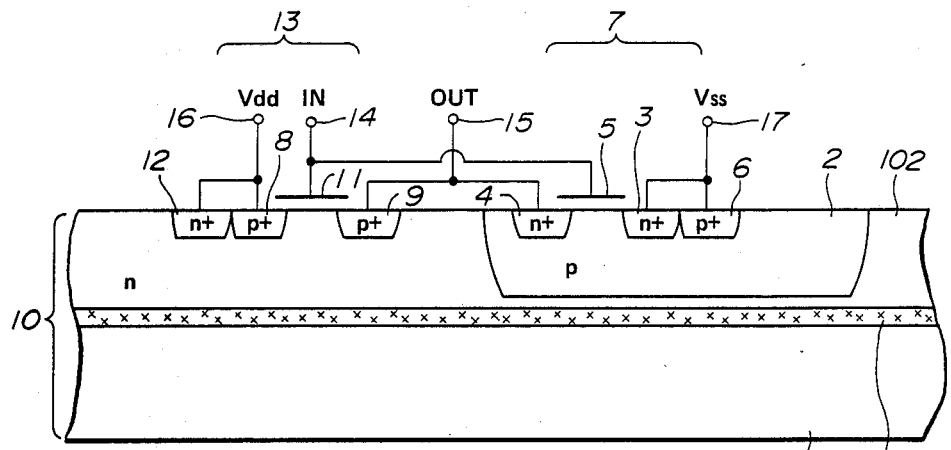
FIG. 1 is a vertical section of a CMOS device according to a first embodiment of the present invention.

One embodiment of the present invention is shown in FIGS. 1 and 2.

A CMOS device shown in FIG. 1 has a semiconductor substrate 10 which is a laminated substrate having an n-type lower substrate 101 and an n-type upper substrate 102 in which nMOS 7 and pMOS 13 are formed.

The device of FIG. 1 further has a recombination layer 105 for recombination of minority carriers. The recombination layer 105 is formed between the upper and lower substrates 102 and 101, and buried in the substrate 10. The recombination layer 105 is apart from a pn junction formed at an interface between the upper substrate 102 of the n-type and a p well 2 formed in the upper substrate 102. The distance between the recombination layer 105 and the pn junction between the upper substrate 102 and the well 2 is equal to or greater than the thickness of a depletion layer formed by this pn junction.

The recombination layer 105 is made of material capable of promoting recombination of holes and electrons. For example, the recombination layer 105 is a layer made of material, such as polycrystalline silicon or amorphous silicon, having plentiful recombination centers of carriers, or an ion implanted crystal damage layer obtained by bombarding ions, such as $Si^+$, $O^+$, and $N^+$, which are low in diffusion rate and tend to make traps in the crystal lattice of the target material, or a layer of a compound semiconductor, such as $Si_xGe_{1-x}$, having a band gap smaller than that of silicon.

The thickness of the recombination layer 105 is made equal to or greater than about 10 nm in order to prevent tunneling of minority carriers.

The separation of the recombination layer 105 from the pn junction formed between the substrate 102 and the p well 2 over the thickness of the depletion layer formed at the pn junction is intended for preventing the recombination layer 105 from impairing characteristics of the pn junction such as reverse withstand voltage.

Figure 2A:
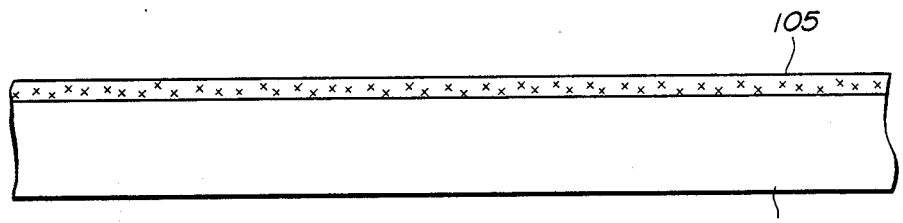
FIGS. 2A, 2B and 2C are vertical sections for showing a fabricating process of the first embodiment.
Figure 2B:
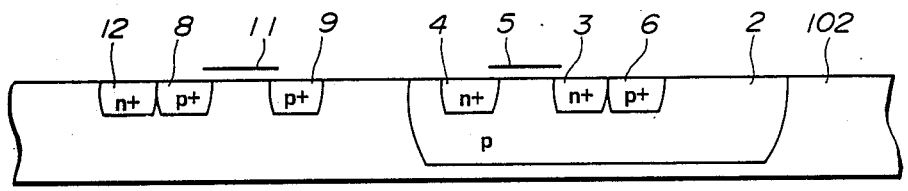
Figure 2C:
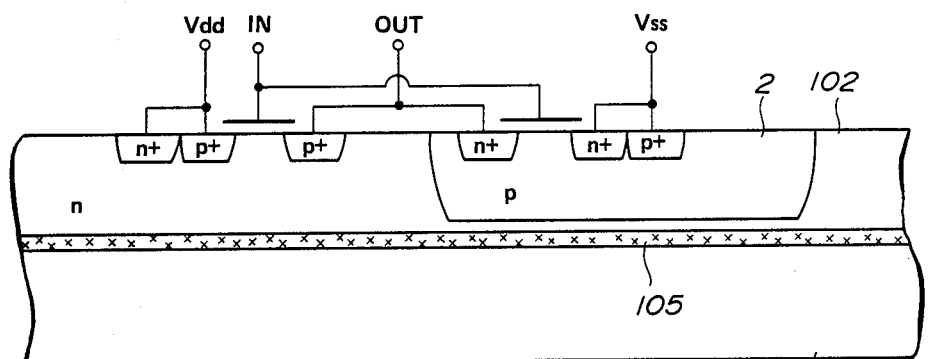

FIGS. 2A, 2B and 2C show one example of a process for fabricating the device of FIG. 1.

At a step shown in FIG. 2A, the recombination layer 105 is formed on a surface of a silicon wafer which eventually forms the lower substrate 101. In this embodiment, the recombination layer 105 is formed by one of the following three methods.

(i) Deposition of polycrystalline silicon, amorphous silicon or other materials having plentiful recombination centers of carriers: In this method, the recombination layer 105 is formed by depositing a polycrystalline silicon, amorphous silicon, or like layer having a thickness of about 100 nm, by LP(low pressure)CVD or other techniques. At this time, doping of impurities of the same conductivity type as the lower substrate 101 and the upper substrate 102, of the recombination layer 105 to lower the resistivity of the recombination layer 105 is effective for enhancing latchup prevention. In this case, the impurity concentration of the recombination layer 105 is higher than that of the substrate 101, and higher than that of the substrate 102.

(ii) Ion implantation: The recombination layer 105 is formed by bombarding the surface of the silicon wafer (that is, the lower substrate 101) with ions, such as $Si^+$, $O^+$ or $N^+$, of a type having a low diffusion rate and a sufficient capability of producing traps, at a high ion implantation level of about $10^{16}$–$10^{18}$ cm$^{-2}$. Ion bombardment results in structural damage to the crystal lattice of the target silicon, and the recombination layer 105 is obtained.

(iii) Formation of a compound semiconductor layer: A layer of compound semiconductor whose band gap is smaller than the band gap of silicon is formed on the surface of the silicon wafer by heteroepitaxy or other appropriate techniques. One example of such a compound semiconductor is $Si_xGe_{1-x}$.

In either case, it is necessary to make the thickness of the resulting recombination layer 105 equal to or greater than about 10 nm in order to prevent tunneling of minority carriers.

At a step shown in FIG. 2B, the pMOS 13, p well 2 and nMOS 7 are formed by known techniques in a major surface of another silicon wafer. This silicon wafer is made into the upper substrate 102 by lapping and polishing the wafer from the bottom surface to the required thickness. In this case, the p well 2 is not bared, and the upper substrate 102 is left under the bottom of the p well 2. The distance between the bottom surface of the upper substrate 102 (i.e., the finished silicon wafer) and the bottom of the p well 2 is greater than the thickness of the depletion layer formed at the pn junction between the upper substrate 102 and the p well 2.

At a step shown in FIG. 2C, the silicon wafer prepared by the step shown in FIG. 2A and the silicon wafer prepared by the step shown in FIG. 2B are directly bonded together to form the semiconductor substrate 10 by tightly putting both wafers one on the other after treatment for making the wafer surfaces hydrophilic, and then annealing the tightly overlapped wafers at a temperature of about 1000° C.

The above-mentioned technique for bonding silicon wafers is known (Japanese patent provisional publication No. 60-51700).

Then, the CMOS device is completed by a step for Al interconnections, a step for passivation and other steps.

In this example, the pMOS 13, nMOS 7 and other components are formed before the bonding of the wafers. However, it is possible to first bond, the wafer formed with the recombination layer 105, as shown in FIG. 2A, and another wafer forming the upper substrate 102, and secondly to form the circuit components in the upper substrate 102 of the bonded body.

Figure 7:
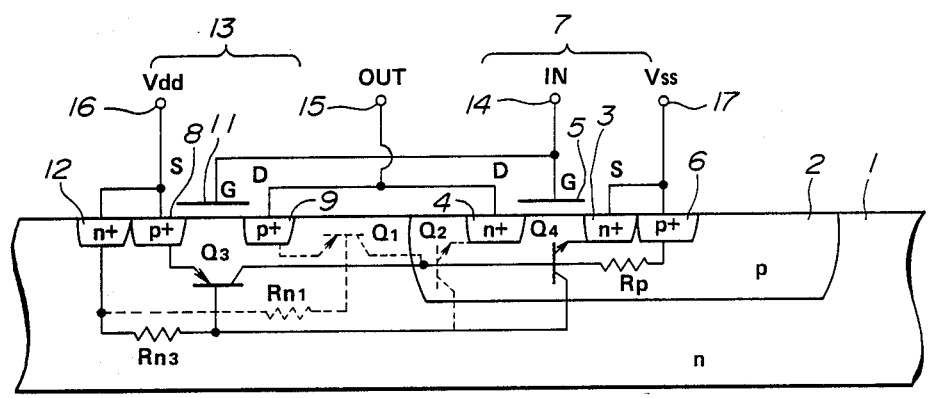
FIG. 7 is a vertical section of a first conventional CMOS device.
Figure 8:
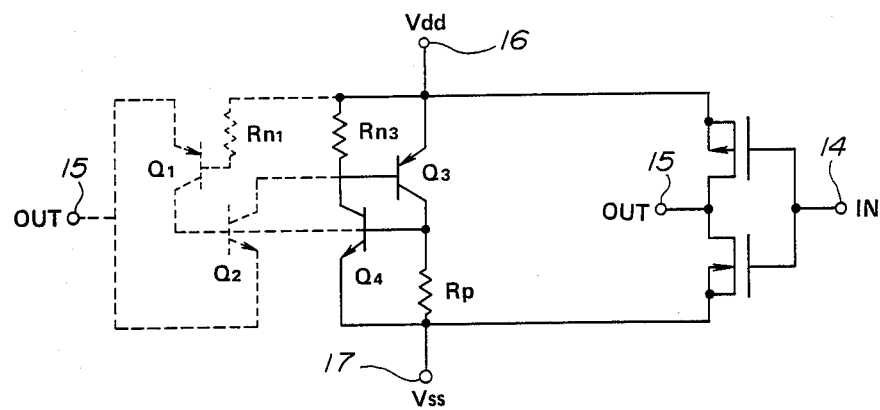
FIG. 8 is a diagram of an equivalent circuit of the first conventional device shown in FIG. 7.
Figure 9:
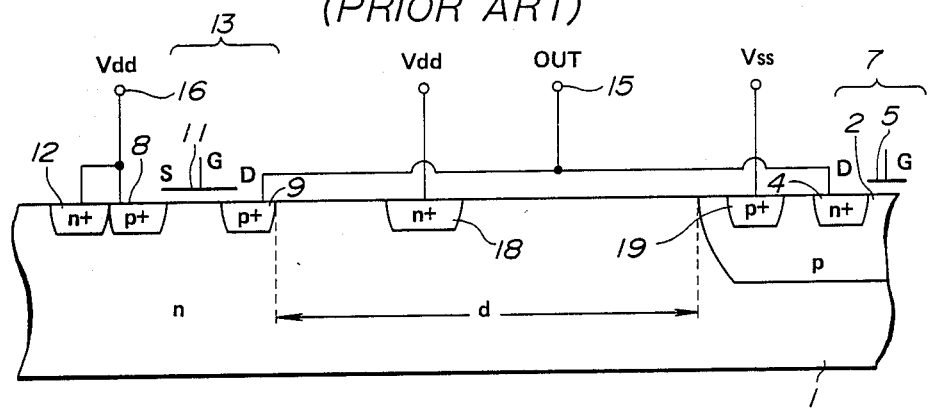
FIG. 9 is a vertical section showing a second conventional CMOS device.
Figure 10:
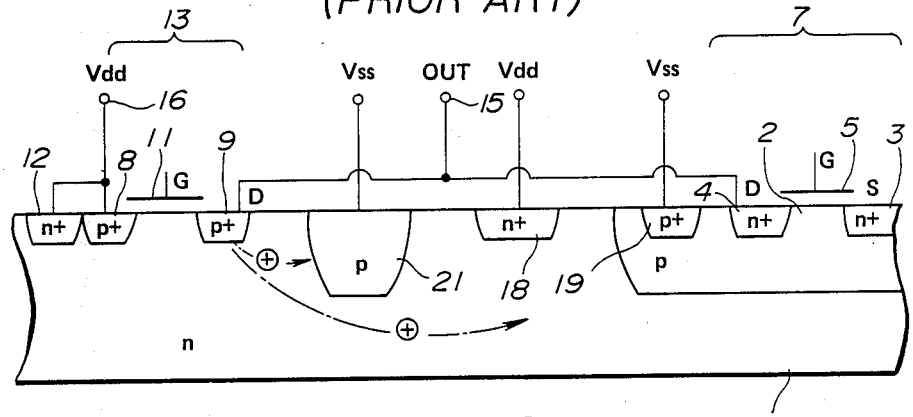
FIG. 10 is a vertical section for showing a third conventional CMOS device.

The thus-formed CMOS device is operated as follows:

In the substrate 10 of this embodiment, there are formed parasitically the pnp transistors $Q_1$ and $Q_3$ and the npn transistors $Q_2$ and $Q_4$ in the same manner as shown in FIGS. 7 and 8.

When, for example, a positive surge voltage above a supply voltage Vdd enters through the output terminal 15, then the parasitic transistors tend to cause latchup in the following manner.

Because of the positive surge voltage, holes (minority carriers) are injected from the p$^+$ drain region 9 of the pMOS 13 into the n-type upper substrate 102, and the transistor $Q_1$ turns on. Accordingly, its collector current flows into the p well 2, and further flows through the base resistance Rp of the transistor $Q_4$ to the low potential terminal 17 of Vss. If the voltage drop across the base resistance Rp exceeds the base threshold voltage of the transistor $Q_4$, then the transistor $Q_4$ turns on, and its collector current flows through the n-type upper substrate 102. This causes an increase of the potential of the upper substrate 102, and the transistor $Q_3$ to turn on. Accordingly, the p$^+$ source region 8 connected with the supply voltage Vdd further supplies the upper substrate 102 with holes, which also flow into the p well 2. In this way, the transistors Q3 and Q4 tend to be turned on, and the device tends to fall into latchup.

In the device of FIG. 1, however, the recombination layer 105 formed immediately and proximately below the p well 2 traps the holes injected into the upper substrate 102 from the p+ drain region 9 and the p+ source region 8, and causes these holes to recombine with electrons and to disappear. Therefore, the number of holes reaching the p well 2 becomes very small, and the potential of the p well 2 is always held at the low potential Vss, at which the state of latchup cannot be sustained. In this way, the capability of withstanding latchup is significantly improved.

When a negative surge voltage below the low potential Vss is applied to the output terminal 15, there arises the following undesired tendency. First, the transistor Q2 is turned on, and then the transistors Q3 and Q4 are succesively turned on. In this case, too, the holes injected from the p+ source region 8 connected with the supply voltage Vdd, into the upper substrate 102 flow into the p well 2. However, the recombination layer 105 reduces, again, the number of the holes reaching the p well 2 by trapping the holes injected into the substrate 102, and improves the latchup withstanding capability.

When the recombination layer 105 is lowered in resistivity by doping of a high concentration level with impurity atoms of the same type as the substrate 101, the recombination layer 105 can prevent latchup more effectively. In this case, an increase of the potential of the upper substrate 102 due to the collector current of the transistor Q4 is not too much because of the low resistivity recombination layer 105 even if the transistor Q4 is turned on. Therefore, the tendency for the transistor Q3 to turn on is further decreased, and the capability of preventing latchup is further improved. The capability of preventing latch up can be further improved by providing a means for connecting the low resistivity recombination layer 105 to the supply voltage Vdd.

A second embodiment of the present invention is shown in FIGS. 3 and 4A–4C. In the second embodiment, a recombination layer 106 is buried in the p well 2.

A semiconductor substrate 10a of the second embodiment is also a laminated substrate which includes a lower substrate 103 and an upper substrate 104 in which the nMOS 7, the pMOS 13 and other components are formed. The recombination layer 106 is formed between the upper and lower substrates 104 and 103.

The recombination layers 105 and 106 of the first and second embodiments are substantially the same in material. The recombination layer 106 is made of polycrystalline or amorphous silicon, or silicon whose crystal lattice is damaged by ion implantation, or a compound semiconductor whose band gap is smaller than that of silicon, or other similar materials. The recombination layer 106 of the second embodiment is heavily doped with impurity atoms of the same conductivity type as that of the p well 2, and therefore, the resistivity of the recombination layer 106 is low. The impurity concentration of the recombination layer 106 is higher than that of the p well 2. A p+ well contact region 22 of the second embodiment is made deeper, and reaches the buried recombination layer 106. Therefore, the recombination layer 106 is connected with the low potential terminal 17 of Vss through the p+ well contact region 22. The recombination layer 106 is buried in the p well 2 at such a position that the recombination layer 106 touches no part of a depletion layer formed by the pn junction between the upper substrate 104 and the p well 2, a depletion layer formed by the junction between the n+ source region 3 and the p well 2, and a depletion layer formed by the junction between the n+ drain region 4 and the p well 2.

Figure 3:
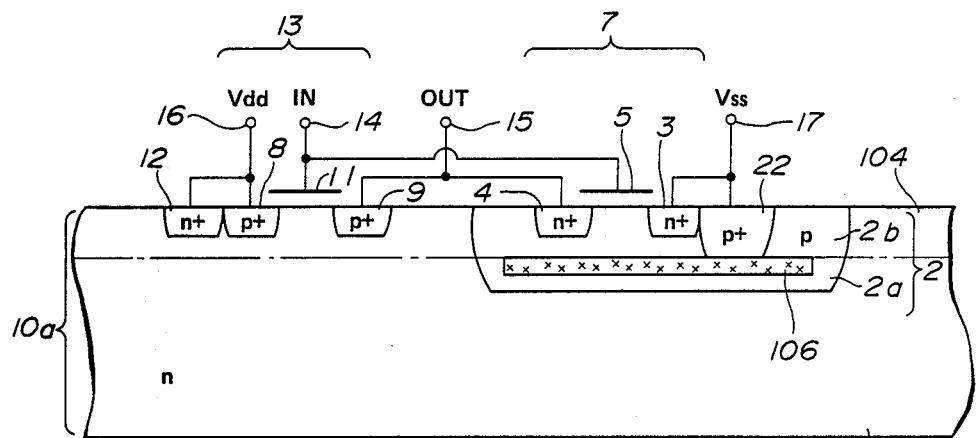
FIG. 3 is a vertical section of a CMOS device according to a second embodiment of the present invention.
Figure 4A:
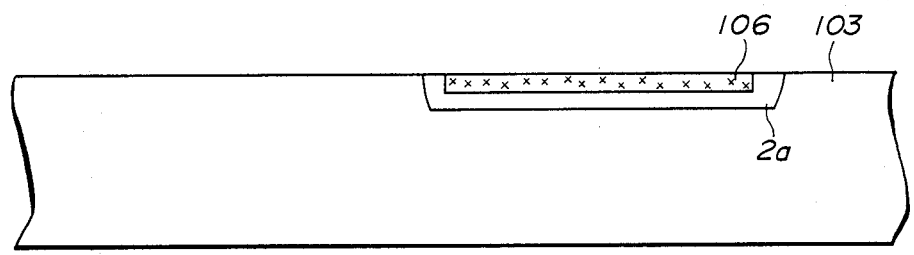
FIGS. 4A, 4B and 4C are vertical sections for showing a fabricating process of the second embodiment.
Figure 4B:
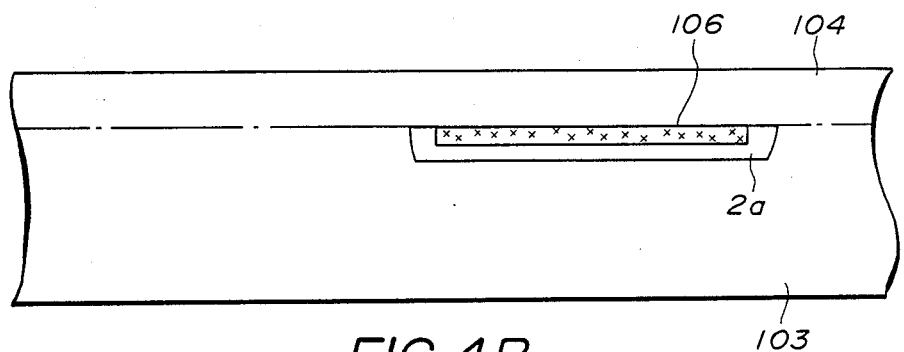
Figure 4C:
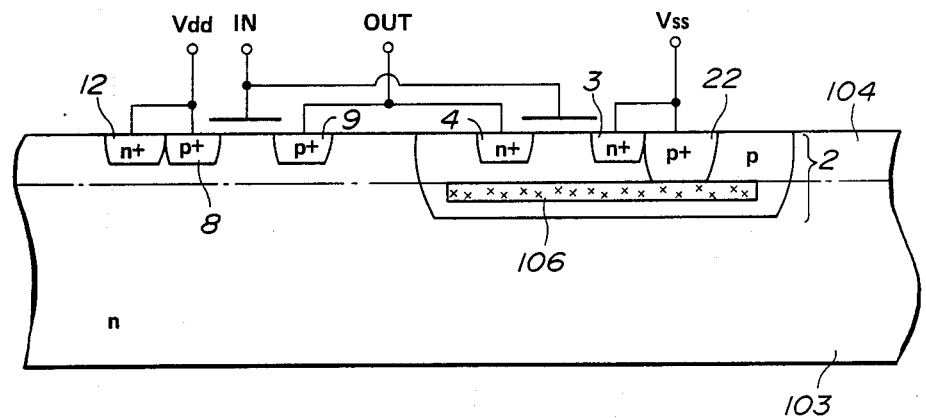
Figure 5:
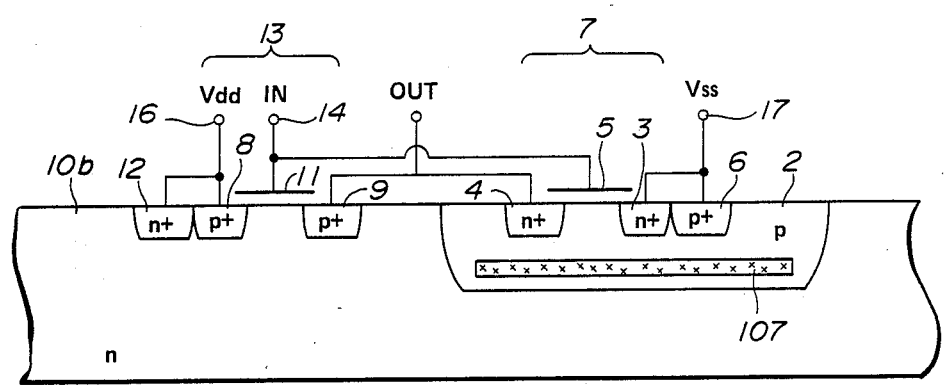
FIG. 5 is a vertical section of a CMOS device according to a third embodiment of the present invention.

FIGS. 4A, 4B and 4C show one example of a process for fabricating the CMOS device of FIG. 3.

At a step shown in FIG. 4A, a p-type diffusion region forming a lower p well 2a is formed in a silicon wafer forming the lower substrate 103. Then, the recombination layer 106 is formed in the lower p well 2a. The recombination layer 106 is formed by one of the methods used for forming the recombination layer 105 of the first embodiment, and is heavily doped with the p-type impurity so that the resistivity of the recombination layer 106 is lowered. Thereafter, the surface is flattened by etchback or other techniques.

At a step of FIG. 4B, another silicon wafer forming the upper substrate 104 is bonded onto the silicon wafer of FIG. 4A by the silicon wafer bonding technique employed in the first embodiment. Therefore, the recombination layer 106 is buried in the semiconductor body under the interface between the silicon wafers. Then, the upper silicon wafer forming the upper substrate 104 is made thin to a desired thickness.

At a step of FIG. 4C, the p well 2 is completed by diffusing an upper p well 2b in the upper substrate 104, and the CMOS is completed by forming the nMOS 7 and the pMOS 13, and other components. In this case, a sufficient alignment between the upper p well 2b, and the lower p well 2a or the recombination layer 106 can be obtained only by mechanical prealignment because the pattern of the p well 2 is relatively rough. If necessary, alignment marks are provided in the silicon wafers.

The recombination layer 106 functions to trap the holes (minority carriers) which flow into the p well 2 after injected into the upper substrate 104 from the p+ drain region 9 and the p+ source region 8 of the pMOS 13 by the action of a positive surge voltage above Vdd, applied to the output terminal 15 or a negative surge voltage below Vss. Therefore, most of the holes reaching the p well 2 are absorbed in the recombination layer 106, and disappear, so that the potential of the p well 2 is barely increased. In this way, the structure of the second embodiment can prevent the transistors Q3 and Q4 from turning on, and significantly reduce the possibility of latchup.

A third embodiment of the present invention is shown in FIGS. 5, 6A, 6B and 6C. A recombination layer 107 of the third embodiment is buried in the p well 2. Therefore, the third embodiment is almost the same as the second embodiment in structure, but the third embodiment employs a simplified fabricating process.

The recombination layer 107 of the third embodiment is formed in the p well 2 at a predetermined depth from the silicon surface by heavy implantation of ions such as Si+.

Figure 6A:
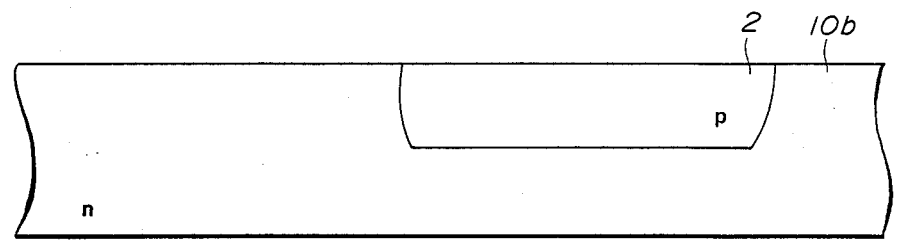
FIGS. 6A, 6B and 6C are vertical sections for showing a fabricating process of the third embodiment.
Figure 6B:
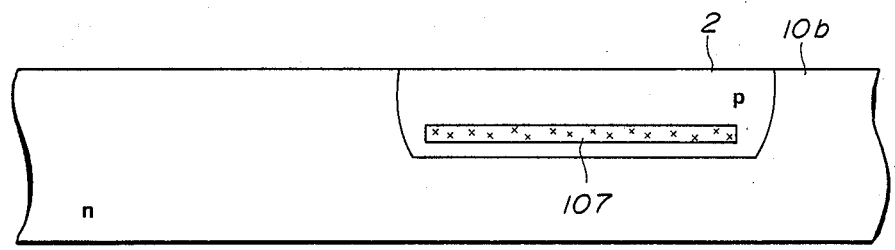
Figure 6C:
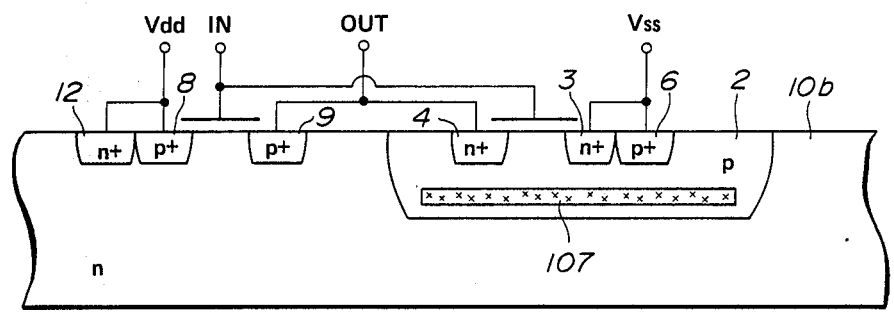

FIGS. 6A, 6B and 6C shown one example of the fabricating process of the third embodiment.

At a step of FIG. 6A, the p well 2 is formed in a major surface of an n-type semiconductor substrate 10b by a conventional technique used in a MOSIC fabrication process.

At a step of FIG. 6B, the recombination layer 107 having a large quantity of recombination centers is formed at a predetermined depth in the p well 2 by photolithography, and ion implantation of a high concentration level with ions, such as Si$^+$, which have a small diffusion rate and a strong tendency to produce traps in the target material. The level of the ion implantation is about $10^{16}$–$10^{\sim}$cm$^{-2}$.

At a step of FIG. 6C, the CMOS device is completed by forming the nMOS 7, the pMOS 13 and other components in the major surface of the substrate 10b by conventional techniques.

The operations of the CMOS device of the third embodiment are almost the same as those of the second embodiment.

It is possible to form the recombination layer 105 of the first embodiment by ion implantation in the same manner as the step of FIG. 6B for forming the recombination layer 107 if the acceleration energy of the ion implantation is made sufficiently high.

In each of the illustrated embodiments, only one recombination layer is formed in either of the p well and the substrate. However, it is optional to employ a structure having one recombination layer formed in the substrate below the p well as in the first embodiment, and another recombination layer formed in the p well as in the second and third embodiments. Such a structure having two buried recombination layers can further improve the latchup withstanding capability of CMOS.

What is claimed is:

1. A CMOS device comprising:
a first substrate region of a first conductivity type located in a semiconductor body which includes upper and lower single crystals, said first substrate region including an upper portion in said upper single crystal and a lower portion in said lower single crystal,
a second substrate region of a second conductivity type, opposite of said first conductivity type, located in said semiconductor body so as to form a pn junction with said first substrate region,
a first conductivity type channel MOSFET in said second substrate region, and a second conductivity type channel MOSFET in said first substrate region, and
a recombination layer in said first substrate region facilitating recombination of minority carriers, said recombination layer being separate from said pn junction, said recombination layer being between said upper and lower portions of said first substrate region.

2. A CMOS device according to claim 1 wherein said recombination layer is spaced from said pn junction so that said recombination layer is not reached by a depletion layer formed by said pn junction.

3. A CMOS device according to claim 2 wherein said recombination layer is made of a material having a higher capability of promoting recombination of minority carriers than a material of said first substrate region.

4. A CMOS device according to claim 3 wherein said recombination layer is a polycrystalline silicon layer.

5. A CMOS device according to claim 3 wherein said recombination layer is an amorphous silicon layer.

6. A CMOS device according to claim 3 wherein said recombination layer has a crystal lattice structure damaged by ion implantation.

7. A CMOS device according to claim 1 wherein said recombination layer is a compound semiconductor layer.

8. A CMOS device according to claim 1 wherein said semiconductor body includes two semiconductor wafers bonded together so that said semiconductor body has an interface between said wafers, said recombination layer being contiguous to said interface.

9. A CMOS device, comprising:
a first substrate region of a first conductivity type in a semiconductor body,
a second substrate region of a second conductivity type, opposite of said first conductivity type, located in said semiconductor body so as to form a junction with said first substrate region,
a first conductivity type channel MOSFET in said second substrate region, and a second conductivity type channel MOSFET in said first substrate region, and
a recombination layer in said first substrate region facilitating recombination of minority carriers, said recombination layer being separate from said junction, said recombination layer being spaced from said junction so that said recombination layer is not reached by a depletion layer formed by said junction, said recombination layer being made of a material having a higher capability of promoting recombination of minority carriers than a material used to fabricate said first substrate region,
wherein said first substrate region is a planar layer including a major surface of said semiconductor body, and said second substrate region is located in said first substrate region so that said second substrate region extends into said first substrate region from said major surface, said recombination layer being in said first substrate region below said second substrate region.

10. A CMOS device according to claim 1 wherein said second substrate region is a planar layer including a major surface of said body, and said first substrate region located in said second substrate region so that said first substrate region extends into said second substrate region from said major surface.

* * * * *